United States Patent
Ueda et al.

(10) Patent No.: US 10,580,645 B2
(45) Date of Patent: Mar. 3, 2020

(54) PLASMA ENHANCED ATOMIC LAYER DEPOSITION (PEALD) OF SiN USING SILICON-HYDROHALIDE PRECURSORS

(71) Applicant: ASM IP HOLDING B.V., Almere (NL)

(72) Inventors: Shinya Ueda, Tokyo (JP); Taishi Ebisudani, Tokyo (JP); Toshiya Suzuki, Tokyo (JP)

(73) Assignee: ASM IP Holding B.V., Almere (NL)

( * ) Notice: Subject to any disclaimer, the term of this patent is extended or adjusted under 35 U.S.C. 154(b) by 99 days.

(21) Appl. No.: 15/966,717

(22) Filed: Apr. 30, 2018

(65) Prior Publication Data

US 2019/0333753 A1  Oct. 31, 2019

(51) Int. Cl.
*H01L 21/02* (2006.01)
*C23C 16/34* (2006.01)
(Continued)

(52) U.S. Cl.
CPC ........ *H01L 21/0228* (2013.01); *C23C 16/345* (2013.01); *C23C 16/4554* (2013.01);
(Continued)

(58) Field of Classification Search
CPC ........... H01L 21/02107; H01L 21/0217; H01L 21/02247; H01L 21/02263;
(Continued)

(56) References Cited

U.S. PATENT DOCUMENTS

| 4,668,365 A | 5/1987 | Foster et al. |
| 4,683,147 A | 7/1987 | Eguchi et al. |

(Continued)

FOREIGN PATENT DOCUMENTS

| JP | 01-103844 | 4/1989 |
| JP | 05-070957 | 3/2003 |

(Continued)

OTHER PUBLICATIONS

Cho, Namtae, "Processing of Boron Carbide," Ph.D. Thesis, School of Materials Science and Engineering, Georgia Institute of Technology, 2006, in 89 pages.

(Continued)

*Primary Examiner* — Maliheh Malek
(74) *Attorney, Agent, or Firm* — Knobbe, Martens, Olson & Bear LLP

(57) ABSTRACT

Methods for forming silicon nitride films are provided. In some embodiments, silicon nitride can be deposited by atomic layer deposition (ALD), such as plasma enhanced ALD. One or more silicon nitride deposition cycle comprise a sequential plasma pretreatment phase in which the substrate is sequentially exposed to a hydrogen plasma and then to a nitrogen plasma in the absence of hydrogen plasma, and a deposition phase in which the substrate is exposed to a silicon precursor. In some embodiments a silicon hydrohalide precursors is used for depositing the silicon nitride. The silicon nitride films may have a high side-wall conformality and in some embodiments the silicon nitride film may be thicker at the bottom of the sidewall than at the top of the sidewall in a trench structure. In gap fill processes, the silicon nitride deposition processes can reduce or eliminate voids and seams.

20 Claims, 6 Drawing Sheets

US 10,580,645 B2

Page 2

(51) Int. Cl.
C23C 16/455 (2006.01)
C23C 16/04 (2006.01)
(52) U.S. Cl.
CPC .... *H01L 21/0217* (2013.01); *H01L 21/02315* (2013.01); *C23C 16/045* (2013.01)
(58) Field of Classification Search
CPC ......... H01L 21/02271; H01L 21/02274; H01L 21/0228; H01L 21/02312–02315; C23C 16/045; C23C 16/345; C23C 16/45525; C23C 16/45527; C23C 16/45536; C23C 16/4554; C23C 16/45542; C23C 16/45553
See application file for complete search history.

(56) References Cited

U.S. PATENT DOCUMENTS

| | | | |
|---|---|---|---|
| 4,696,834 A | 9/1987 | Varaprath | |
| 6,391,803 B1 | 5/2002 | Kim et al. | |
| 6,475,276 B1 | 11/2002 | Elers et al. | |
| 6,586,056 B2 | 7/2003 | Arkles et al. | |
| 6,730,614 B1 | 5/2004 | Lim et al. | |
| 6,756,318 B2 | 6/2004 | Nguyen et al. | |
| 6,933,245 B2 | 8/2005 | Lee et al. | |
| 7,144,806 B1* | 12/2006 | Fair ........................ C23C 16/14 438/653 | |
| 7,473,655 B2 | 1/2009 | Wang et al. | |
| 7,625,609 B2 | 12/2009 | Matsuura | |
| 7,651,955 B2 | 1/2010 | Ranish et al. | |
| 7,713,592 B2 | 5/2010 | Nguyen et al. | |
| 7,713,874 B2 | 5/2010 | Milligan | |
| 8,080,290 B2 | 12/2011 | Hasebe et al. | |
| 8,114,761 B2 | 2/2012 | Mandrekar et al. | |
| 8,119,544 B2 | 2/2012 | Hasebe et al. | |
| 8,236,097 B2 | 8/2012 | Wang et al. | |
| 8,242,031 B2 | 8/2012 | Mallick et al. | |
| 8,298,628 B2 | 10/2012 | Yang et al. | |
| 8,329,599 B2 | 12/2012 | Fukazawa et al. | |
| 8,563,096 B2 | 10/2013 | Matsunaga et al. | |
| 8,580,664 B2 | 11/2013 | Clark | |
| 8,592,328 B2 | 11/2013 | Hausmann et al. | |
| 8,647,722 B2* | 2/2014 | Kobayashi ............ C23C 16/345 427/569 | |
| 8,722,546 B2 | 5/2014 | Fukazawa et al. | |
| 9,455,138 B1 | 9/2016 | Fukazawa et al. | |
| 9,564,309 B2 | 2/2017 | Niskanen et al. | |
| 9,576,792 B2* | 2/2017 | Chen .................. H01L 21/0228 | |
| 9,627,221 B1* | 4/2017 | Zaitsu ............... H01L 21/31116 | |
| 9,824,881 B2 | 11/2017 | Niskanen et al. | |
| 9,905,416 B2 | 2/2018 | Niskanen et al. | |
| 9,960,033 B1* | 5/2018 | Nozawa .............. H01L 21/0228 | |
| 9,984,869 B1* | 5/2018 | Blanquart ........... H01L 21/0217 | |
| 10,269,559 B2* | 4/2019 | Abel ................. H01L 21/02274 | |
| 10,410,857 B2* | 9/2019 | Suzuki .............. C23C 16/45553 | |
| 2001/0012701 A1 | 8/2001 | Kang et al. | |
| 2002/0061659 A1 | 5/2002 | Abe | |
| 2002/0068466 A1 | 6/2002 | Lee et al. | |
| 2002/0119327 A1 | 8/2002 | Arkles et al. | |
| 2002/0151426 A1 | 10/2002 | Murata et al. | |
| 2002/0180028 A1 | 12/2002 | Borovik et al. | |
| 2003/0097987 A1 | 5/2003 | Fukada | |
| 2003/0215570 A1 | 11/2003 | Seutter et al. | |
| 2003/0228770 A1 | 12/2003 | Lee et al. | |
| 2004/0121085 A1 | 6/2004 | Wang et al. | |
| 2004/0142557 A1* | 7/2004 | Levy ................. C23C 16/45534 438/680 | |
| 2004/0146644 A1 | 7/2004 | Xiao et al. | |
| 2004/0224089 A1 | 11/2004 | Singh et al. | |
| 2005/0000430 A1 | 1/2005 | Jang et al. | |
| 2005/0025885 A1 | 2/2005 | McSwiney et al. | |
| 2005/0145177 A1 | 7/2005 | McSwiney et al. | |
| 2005/0159017 A1 | 7/2005 | Kim et al. | |
| 2005/0181633 A1 | 8/2005 | Hochberg et al. | |
| 2005/0282350 A1 | 12/2005 | Chou et al. | |
| 2006/0019032 A1 | 1/2006 | Wang et al. | |
| 2006/0084283 A1 | 4/2006 | Paranjpe et al. | |
| 2006/0148271 A1 | 7/2006 | Borovik et al. | |
| 2006/0213437 A1 | 9/2006 | Ishizaka et al. | |
| 2007/0026540 A1 | 2/2007 | Nooten et al. | |
| 2007/0116888 A1 | 5/2007 | Faguet | |
| 2007/0232071 A1 | 10/2007 | Balseanu et al. | |
| 2007/0251444 A1 | 11/2007 | Gros-Jean et al. | |
| 2008/0020591 A1 | 1/2008 | Balseanu et al. | |
| 2008/0020593 A1 | 1/2008 | Wang et al. | |
| 2008/0050523 A1 | 2/2008 | Kitazoe et al. | |
| 2008/0146033 A1 | 6/2008 | Park | |
| 2008/0242077 A1 | 10/2008 | Clark | |
| 2008/0242116 A1 | 10/2008 | Clark | |
| 2008/0274605 A1 | 11/2008 | Hoshi et al. | |
| 2008/0292798 A1 | 11/2008 | Huh et al. | |
| 2009/0155606 A1 | 6/2009 | Yoon et al. | |
| 2009/0163041 A1 | 6/2009 | Mungekar et al. | |
| 2009/0246972 A1 | 10/2009 | Kher et al. | |
| 2009/0263972 A1 | 10/2009 | Balseanu et al. | |
| 2009/0269941 A1 | 10/2009 | Raisanen et al. | |
| 2009/0275210 A1 | 11/2009 | Shanker et al. | |
| 2009/0311857 A1 | 12/2009 | Todd et al. | |
| 2010/0041243 A1 | 2/2010 | Cheng et al. | |
| 2010/0124621 A1 | 5/2010 | Kobayashi et al. | |
| 2010/0184302 A1 | 7/2010 | Lee et al. | |
| 2010/0285237 A1 | 11/2010 | Ditizio et al. | |
| 2010/0304047 A1 | 12/2010 | Yang et al. | |
| 2010/0304574 A1 | 12/2010 | Nodera et al. | |
| 2011/0014795 A1 | 1/2011 | Lee et al. | |
| 2011/0086516 A1 | 4/2011 | Lee et al. | |
| 2011/0129990 A1 | 6/2011 | Mandrekar et al. | |
| 2011/0136343 A1 | 6/2011 | Wang et al. | |
| 2011/0136347 A1 | 6/2011 | Kovarsky et al. | |
| 2011/0159703 A1* | 6/2011 | Liang .................... C23C 16/345 438/791 | |
| 2011/0244690 A1 | 10/2011 | Shanker et al. | |
| 2011/0256734 A1* | 10/2011 | Hausmann ............ C23C 16/045 438/776 | |
| 2012/0009802 A1 | 1/2012 | LaVoie et al. | |
| 2012/0021127 A1 | 1/2012 | Sato et al. | |
| 2012/0021138 A1 | 1/2012 | Ditizio et al. | |
| 2012/0028454 A1 | 2/2012 | Shankar et al. | |
| 2012/0028469 A1 | 2/2012 | Onizawa et al. | |
| 2012/0077350 A1 | 3/2012 | Miya et al. | |
| 2012/0153442 A1 | 6/2012 | Honda et al. | |
| 2012/0164848 A1 | 6/2012 | Fujii et al. | |
| 2012/0178264 A1 | 7/2012 | Murakami et al. | |
| 2012/0196048 A1 | 8/2012 | Ueda | |
| 2012/0196450 A1 | 8/2012 | Balseanu et al. | |
| 2012/0213940 A1 | 8/2012 | Mallick | |
| 2012/0220139 A1 | 8/2012 | Lee et al. | |
| 2012/0295449 A1 | 11/2012 | Fukazawa | |
| 2013/0040447 A1 | 2/2013 | Swaminathan et al. | |
| 2013/0065371 A1 | 3/2013 | Wei et al. | |
| 2013/0078392 A1 | 3/2013 | Xiao et al. | |
| 2013/0084714 A1 | 4/2013 | Oka et al. | |
| 2013/0095664 A1 | 4/2013 | Matero et al. | |
| 2013/0115374 A1 | 5/2013 | Jayakar et al. | |
| 2013/0115763 A1 | 5/2013 | Takamure et al. | |
| 2013/0157466 A1 | 6/2013 | Fox et al. | |
| 2013/0171839 A1 | 7/2013 | Nguyen et al. | |
| 2013/0175621 A1 | 7/2013 | Chen et al. | |
| 2013/0183835 A1 | 7/2013 | Nguyen et al. | |
| 2013/0189854 A1* | 7/2013 | Hausmann .......... H01L 21/0217 438/792 | |
| 2013/0224964 A1 | 8/2013 | Fukuzawa et al. | |
| 2013/0244446 A1 | 9/2013 | Tsuji et al. | |
| 2013/0252439 A1 | 9/2013 | Hirose et al. | |
| 2013/0323435 A1 | 12/2013 | Xiao et al. | |
| 2013/0330933 A1 | 12/2013 | Fukuzawa et al. | |
| 2014/0023794 A1 | 1/2014 | Mahajani et al. | |
| 2014/0030444 A1 | 1/2014 | Swaminathan et al. | |
| 2014/0051263 A1 | 2/2014 | Tanaka et al. | |
| 2014/0073144 A1 | 3/2014 | Chatterjee et al. | |
| 2014/0113457 A1 | 4/2014 | Sims et al. | |
| 2014/0124841 A1 | 5/2014 | Xie et al. | |
| 2014/0141625 A1 | 5/2014 | Fukazawa et al. | |

(56) References Cited

U.S. PATENT DOCUMENTS

| | | | |
|---|---|---|---|
| 2014/0174353 A1 | 6/2014 | Spangler et al. | |
| 2014/0193983 A1 | 7/2014 | LaVoie | |
| 2014/0227458 A1 | 8/2014 | Karakawa et al. | |
| 2014/0273477 A1 | 9/2014 | Niskanen et al. | |
| 2014/0273527 A1* | 9/2014 | Niskanen | C23C 16/345 438/792 |
| 2014/0273528 A1 | 9/2014 | Niskanen et al. | |
| 2014/0273529 A1 | 9/2014 | Nguyen et al. | |
| 2014/0273530 A1 | 9/2014 | Nguyen et al. | |
| 2014/0273531 A1 | 9/2014 | Niskanen et al. | |
| 2014/0287164 A1 | 9/2014 | Xiao et al. | |
| 2014/0342573 A1 | 11/2014 | Hirose et al. | |
| 2014/0363980 A1 | 12/2014 | Kawamata et al. | |
| 2015/0031218 A1 | 1/2015 | Karakawa | |
| 2015/0104954 A1 | 4/2015 | Pore | |
| 2015/0104955 A1 | 4/2015 | Pore | |
| 2015/0162185 A1* | 6/2015 | Pore | H01L 21/0234 438/786 |
| 2015/0206719 A1 | 7/2015 | Swaminathan et al. | |
| 2015/0255324 A1 | 9/2015 | Li et al. | |
| 2015/0259791 A1 | 9/2015 | Hausmann et al. | |
| 2015/0287591 A1 | 10/2015 | Pore et al. | |
| 2016/0079054 A1* | 3/2016 | Chen | H01L 21/0228 438/762 |
| 2017/0062204 A1* | 3/2017 | Suzuki | H01L 21/0217 |
| 2017/0372886 A1 | 12/2017 | Chen et al. | |
| 2018/0033625 A1* | 2/2018 | Yoo | H01L 21/225 |
| 2018/0068844 A1 | 3/2018 | Chen et al. | |
| 2018/0151346 A1* | 5/2018 | Blanquart | H01L 29/66545 |
| 2018/0182613 A1* | 6/2018 | Blanquart | H01L 21/02164 |
| 2018/0286663 A1* | 10/2018 | Kobayashi | H01L 21/0234 |
| 2018/0350587 A1* | 12/2018 | Jia | H01L 21/0228 |
| 2019/0057858 A1* | 2/2019 | Hausmann | H01L 21/31122 |
| 2019/0080903 A1* | 3/2019 | Abel | H01L 21/02164 |
| 2019/0148398 A1* | 5/2019 | Kim | H01L 27/11556 438/710 |
| 2019/0259598 A1* | 8/2019 | Chen | H01L 21/02208 |
| 2019/0279866 A1* | 9/2019 | Pore | C23C 16/30 |
| 2019/0295838 A1* | 9/2019 | Chen | C23C 16/045 |
| 2019/0330736 A1* | 10/2019 | Wang | C23C 16/45538 |
| 2019/0348271 A1* | 11/2019 | Yan | H01L 21/02211 |
| 2019/0371594 A1* | 12/2019 | Niskanen | H01L 21/0228 |

FOREIGN PATENT DOCUMENTS

| | | |
|---|---|---|
| JP | 2006/190770 | 7/2006 |
| JP | 2010-103484 | 5/2010 |
| JP | 2012-138641 | 7/2012 |
| JP | 2012-216873 | 8/2012 |
| JP | 2013/125762 | 6/2013 |
| KR | 101491726 | 2/2015 |
| WO | WO 2011/162136 | 12/2011 |
| WO | WO 2012/144523 | 10/2012 |
| WO | WO 2013/121936 | 8/2013 |

OTHER PUBLICATIONS

Domnich, et al., "Boron Carbide: Structures, Properties, and Stability under Stress," J. Am. Ceram. Soc., vol. 94, No. 11, 2011, pp. 3605-3628.
File History of U.S. Appl. No. 13/830,084, filed Mar. 14, 2013.
File History of U.S. Appl. No. 14/062,328, filed Oct. 24, 2013.
File History of U.S. Appl. No. 14/167,904, filed Jan. 29, 2014.
File History of U.S. Appl. No. 14/834,290, filed Aug. 24, 2015.
Keinan et al., "Diiodosilane. 3. Direct Synthesis of Acyl Iodides from Carboxylic Acids, Esters, Lactones, Acyl Chlorides, and Anhydrides," J. Org. Chem. (1990), 55, 3922-3926.
Keinan et al., "Diiodosilane. 2. A Multipurpose Reagent for Hyddrolysis and Reductive Iodination of Ketals, Acetals, Ketones, and Aldehydes," J. Org. Chem. (1990), 55, 2927-2938.
Keinan et al., "Diiodosilane. 1. A Novel Reagent for Deoxygenation of Alcohols and Ethers," J. Org. Chem. (1987), 52, 4846-4851.
Knoops, Harm C.M. et al. "Plasma-assisted ALD of Silicon Nitride from BTBAS, 131h International Conference on Atomic Layer Deposition," Jul. 28-31, 2013, San Diego, California, U.S.A., 21 pages.
Lin et al., "Silicon Nitride Films Deposited by Atmospheric Pressure Chemical Vapor Deposition", Mat. Res. Soc. Symp. Proc. vol. 495, 1998 Materials Research Society, pp. 107-112.
Lowenstein, et al., "Chemical etching of thermally oxidized silicon nitride: comparison of wet dry etching methods", Journal of the Electrochemical Society, vol. 138, No. 5, 1991, 1389-1394.
Pedersen, et al. "Low Temperature CVD of Thin, Amorphous Boron-Carbon Films for Neutron Detectors," 2012, Chemical Vapor Deposition, (18), 7-9, 221-224.
Sarubbi, et al., "Pure Boron-Doped Photodiodes: a Solution for Radiation Detection in EUV Lithography," ESSDERC 2008—38th European Solid-State Device Research Conference, 2008, pp. 278-281.
Tamizhmani et al., "Physical Characterization of a-Si Thin Films Deposited by Thermal Decomposition of Iodosilanes," J. Phys. D: Appl. Phys. 24 (1991), 1015-1021.
Tamizhmani et al., "Some Physical Properties of Undoped Amorphous Silicon Prepared by a New Chemical Vapor Deposition Process Using Iodosilanes", Chem. Mater. (1990), 2, 473-476.
Triyoso et al., "Robust PEALD SiN spacer for gate first high-k metal gate integration", IEEE, 2012, 4 pages.
File History of U.S. Appl. No. 15/703,241, filed Sep. 13, 2017.
File History of U.S. Appl. No. 15/414,485, filed Jan. 24, 2017.
File History of U.S. Appl. No. 15/902,300, filed Feb. 22, 2018.
File History of U.S. Appl. No. 14/855,261, filed Sep. 15, 2015.
File History of U.S. Appl. No. 15/426,593, filed Feb. 7, 2017.
File History of U.S. Appl. No. 15/706,435, filed Sep. 15, 2017.
File History of U.S. Appl. No. 16/381,634, filed Apr. 11, 2019.
File History of U.S. Appl. No. 16/574,542, filed Sep. 18, 2019.
File History of U.S. Appl. No. 16/540,349, filed Aug. 14, 2019.
File History of U.S. Appl. No. 16/543,917, filed Aug. 19, 2019.

* cited by examiner

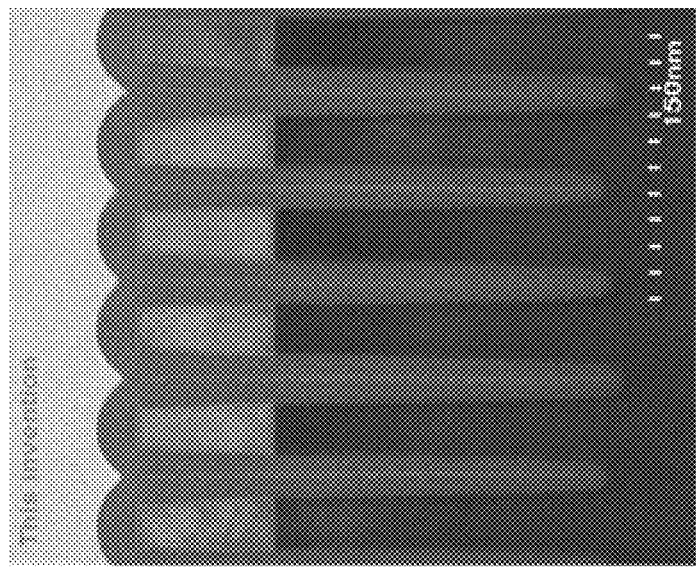
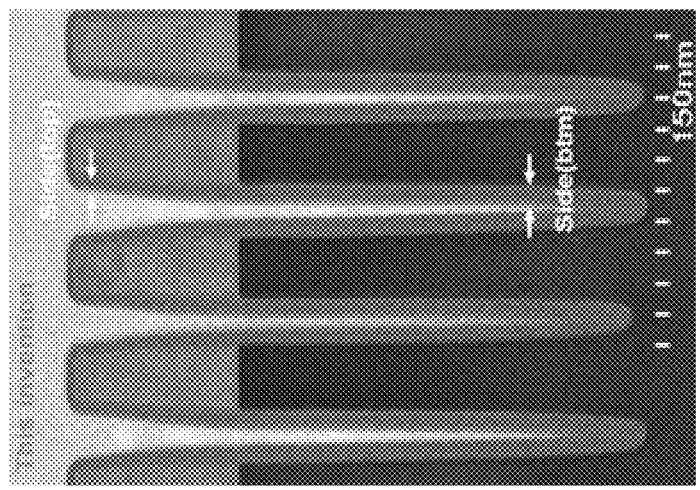
FIG. 6A
FIG. 6B

PLASMA ENHANCED ATOMIC LAYER DEPOSITION (PEALD) OF SIN USING SILICON-HYDROHALIDE PRECURSORS

BACKGROUND

Field

The present disclosure relates generally to the field of semiconductor device manufacturing and, more particularly, to atomic layer deposition of silicon nitride films with hydrogen plasma and nitrogen plasma treatment steps.

Description of the Related Art

Silicon nitride (SiN) films deposited on three-dimensional structures by typical Plasma-Enhanced Atomic Layer Deposition (PEALD) processes may have a number of undesirable features, such as a low side-wall conformality and/or relatively poor step coverage, leading to problems such as the formation of voids in a gap-fill process. This is especially true when SiN is deposited by PEALD onto structures with high aspect ratios (AR). FIG. 1 illustrates a scanning transmission electron microscopy (STEM) image of a typical example of a silicon nitride film deposited by PEALD over a three-dimensional structure on substrate with an aspect ratio of 10 by conventional methods.

The lack of side-wall conformality may result from a higher growth rate at the entrance of the trench or other feature, with slower growth inside due, at least in part, to non-uniform reactant exposure inside the trench. A lack of conformality may also result from re-sputtering at the entrance of the trench during plasma treatment. The film quality may be sufficient for the target application on the top of the trench, or on planar regions of the three-dimensional structure, but not on the sidewalls or other non-horizontal or vertical surfaces of the three-dimensional structure.

SUMMARY

Silicon nitride films can be deposited using atomic layer deposition. In some embodiments, silicon nitride can be deposited by atomic layer deposition (ALD), such as plasma enhanced ALD. In some embodiments, a plasma pretreatment phase comprising a first plasma treatment step and a second plasma treatment step is carried out as part of a PEALD deposition cycle for forming silicon nitride. In one or more deposition cycles, the plasma pretreatment phase comprises sequentially exposing the substrate to a hydrogen plasma and a nitrogen plasma in the absence of hydrogen plasma.

Following the plasma pretreatment phase, a silicon nitride deposition phase is carried out in the silicon nitride deposition cycle. In the silicon nitride deposition phase, the substrate is exposed to a silicon precursor. In some embodiments the substrate is alternately and sequentially exposed to silicon precursor and a nitrogen reactant. In some embodiments a silicon hydrohalide precursors is used for depositing the silicon nitride. In some embodiments the silicon nitride deposition phase is carried out before the plasma pretreatment phase in two or more consecutive silicon nitride deposition cycles. In such embodiments, the plasma pretreatment process modifies the substrate surface prior to the silicon nitride deposition phase of a following silicon nitride deposition cycle.

The silicon nitride films deposited by the disclosed methods may have a high side-wall conformality and in some embodiments the silicon nitride film may be thicker at the bottom of the sidewall than at the top of the sidewall in a trench structure. In gap fill processes, the silicon nitride deposition processes can reduce or eliminate voids and seams.

BRIEF DESCRIPTION OF THE DRAWINGS

The invention will be better understood from the Detailed Description and from the appended drawings, which are meant to illustrate and not to limit the invention, and wherein:

FIGS. 6A and 6B are images of silicon nitride films deposited according to methods disclosed herein.

DETAILED DESCRIPTION

Figure 1:
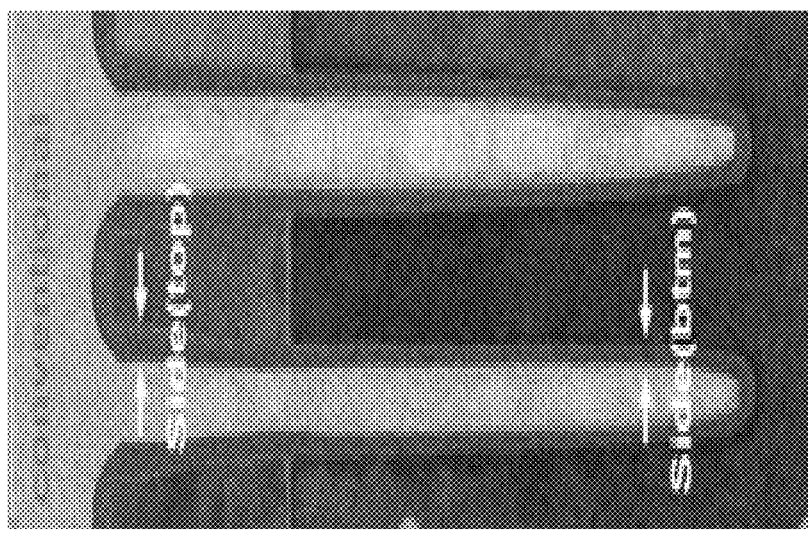
FIG. 1 illustrates a STEM image of a SiN film that was deposited on a three-dimensional structure with an AR of 10 by conventional methods.

Silicon nitride films have a wide variety of applications both in the semiconductor industry and outside of the semiconductor industry, as will be apparent to the skilled artisan. For example, silicon nitride films are used in planar logic, DRAM, and NAND Flash devices. In some applications it is desirable to deposit conformal silicon nitride thin films on three-dimensional structures.

According to some embodiments of the present disclosure, various plasma-enhanced atomic layer deposition (PEALD) methods for depositing silicon nitride films are provided. In some embodiments the PEALD methods utilize a sequential plasma pretreatment process in one or more deposition cycles. The sequential plasma pretreatment process comprises a first plasma treatment step in which the substrate is contacted with a hydrogen plasma, and a subsequent second plasma treatment step in which the substrate is contacted with a nitrogen plasma in the absence of hydrogen plasma. The sequential plasma pretreatment process is carried out prior to contacting the substrate with a silicon precursor (either within the deposition cycle or in the following deposition cycle) and can serve to control adsorption of the silicon precursor to substrate surfaces. By controlling the adsorption of silicon precursor, the deposition and quality of the SiN can be controlled. In some embodiments the silicon precursor adsorption is controlled such that a smaller amount of silicon precursor is adsorbed at the top of a three-dimensional structure, such as at the top of a trench, while a larger amount of silicon precursor is adsorbed at the inside or sidewall of a trench. In this way, a film with increased conformality can be deposited on the three-dimensional structure.

In some embodiments the methods are used in gap-fill SiN deposition processes. In some embodiments the methods are used to deposit SiN for hard mask applications, such as in forming a SiN liner on a deep trench, for example a trench having an aspect ratio of about 10 or greater.

In some embodiments a silicon nitride thin film is deposited over a three dimensional structure on a substrate. In some embodiments, the three-dimensional structure on which the SiN film is deposited, such as a gap or trench, has a high aspect ratio. For example, the aspect ratio can be from about 3 to about 20, such as equal to or greater than 3, equal to or greater than 5, equal to or greater than 7, equal to or greater than 8, equal to or greater than 9, equal to or greater than 10, equal to or greater than 15, or even equal to or greater than 20. In some embodiments, the three-dimensional structure comprises two side-walls as well as a top or planar surface.

In some embodiments, silicon nitride films can have a conformality (top of feature to side wall) of about 100% for high aspect ratio trenches. In some embodiments the growth rate of SiN inside the trench is faster than the growth rate of SiN at the top of the trench. In some embodiments, the growth rate inside of a gap or trench can be faster than the growth rate inside the gap or trench that can be obtained by methods of depositing SiN that do not use a sequential plasma pretreatment step as described herein. In some embodiments the growth rate at the top of a gap or trench can be lower than the growth rate at the top of a gap or trench that is obtained by methods that do not use a sequential plasma pretreatment step as described herein.

In some embodiments the silicon nitride films have high side-wall conformality. Side-wall conformality is defined, for the purpose of this application, as [(thickness of the SiN film at the bottom of a sidewall)/(thickness of the SiN film at the top of the side wall)]×100%. In some embodiments the methods can be used to deposit SiN films that have a side-wall conformality of about 100%. That is, there is little variation in the thickness of the sidewall from the top portion of the sidewall to the bottom portion of the side wall. In some embodiments the methods can be used to deposit SiN films that are thicker at the bottom of a side wall than at the top of a side wall in a three-dimensional structure such as a trench, thus having greater than 100% conformality. The side-wall conformality, for example, may be equal to or greater than 85%, equal to or greater than 95%, equal to or greater than 100%, equal to or greater than 105%, equal to or greater than 125%, equal to or greater than 150%, equal to or greater than 175%, or even equal to or greater than 200%.

In some embodiments, the silicon nitride films have a low wet etch rate. In some embodiments, the WER can be from less than or equal to 5 Å/min to about 200 Å/min, for example about 20 Å/min, 40 Å/min, 60 Å/min, 80 Å/min, 100 Å/min, 120 Å/min, 140 Å/min, 160 Å/min, 180 Å/min, or 200 Å/min. In some embodiments, the WER can be between about 200 Å/min and 240 Å/min. The wet etch rate may be measured in 100:1 dilute hydrofluoric acid. In some embodiments the wet etch rate may be adjusted by adjusting the power of the sequential plasma treatment.

In some embodiments, the WER of the side-wall of a feature is low. For example, the WER can be less than or equal to 5 Å/min in 100:1 dilute hydrofluoric acid.

In some embodiments the SiN films are deposited on a three-dimensional structure having side-walls, and the films have a side-wall conformality of greater than 95% and an etch rate of less than 5 Å/min in 100:1 dilute HF.

In some embodiments, the SiN films demonstrate increased resistance to wet etch as compared to films that are formed without the hydrogen and nitrogen plasma pretreatment described herein. In some embodiments, the SiN films have increased etch rate uniformity of horizontal surfaces relative to vertical surfaces on 3-D features, decreased wet etch rate (WER), and/or decreased wet etch rate ratio (WERR) relative to thermal oxide (TOX). In some embodiments the WERR relative to $SiO_2$ may be from about 0.1 to about 10.

In some embodiments, a silicon nitride thin film formed on a 3-D feature according to one or more processes described herein can demonstrate a ratio of a wet etch rate (WER) of the silicon nitride thin film on the sidewalls of the 3-D feature to a wet etch rate (WER) of the silicon nitride thin film on a top region of the 3-D features of about 0.02 to about 3.0, from about 0.2 to about 2.8, from about 0.75 to about 1.5, or from about 0.9 to about 1.1 in 0.5% dilute hydrofluoric acid. For example, for side-wall hard mask applications where the top of the feature is to be removed while the side-wall remains, the WER at a top region can be high (for example, about 24-240 Å/min) while the WER at the side-wall can be low (for example, 5-15 Å/min). In these instances, a high power plasma can be applied to keep the ratio of the side-wall WER to the top WER at about 0.02. In some embodiments the side-wall WER to top WER can be kept at between 0.01 to 0.03, such as at 0.015, 0.02, 0.025 or 0.03.

In some embodiments, utilizing a plasma pretreatment in SiN PEALD deposition as described herein may facilitate formation of silicon nitride films useful in applications such as sacrificial layers, gate spacers and/or spacer defined double/quadruple patterning (SDDP/SDQP) in state-of-the-art semiconductor devices such as FiNFETs and other multigate transistors.

In some embodiments, step coverage can be as high as 300%, for example from about 100% to about 300%, such as 100%, 150%, 200%, 250%, or 300%. Step coverage is defined as the ratio of the thickness of SiN film at the bottom of a void or gap to the thickness of the SiN film at the top of the void or gap.

In some embodiments, the SiN deposited on the substrate can have a high top to side conformality. In some embodiments, the ratio between the thickness of the SiN deposited on the sidewall of the three-dimensional structure on the substrate to the thickness of the SiN deposited on the top of the three-dimensional structure on the substrate is greater than or equal to 0.8. In some embodiments, this ratio can be greater than or equal to 0.95. In some embodiments, this ratio can be greater than or equal to 1. In some embodiments, this ratio can be greater than or equal to 1.05. In some embodiments, this ratio can be greater than or equal to 2.

In some embodiments, the SiN deposition over the three-dimensional structure on the substrate is substantially conformal such that in a gap-fill process a minimal void or seam is created. In some embodiments, no void or seam is visible. In some embodiments, less than 5% of trenches over a three-dimensional structure pattern contain a void after the SiN deposition.

The formula of the silicon nitride is generally referred to herein as SiN for convenience and simplicity. However, the skilled artisan will understand that the actual formula of the silicon nitride, representing the Si:N ratio in the film and excluding hydrogen or other impurities, can be represented as $SiN_x$, where x varies from about 0.5 to about 2.0, as long as some Si—N bonds are formed. In some cases, x may vary from about 0.9 to about 1.7, from about 1.0 to about 1.5, or from about 1.2 to about 1.4. In some embodiments silicon nitride is formed where Si has an oxidation state of +IV and the amount of nitride in the material might vary.

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging with an inert gas.

According to some embodiments, ALD-type processes are used to form SiN thin films on substrates such as integrated circuit workpieces. In some embodiments SiN films are deposited on one or more three-dimensional structures on the substrates. In some embodiments, the ALD-type processes comprise multiple deposition cycles, each comprising a SiN deposition phase comprising alternate and sequential contact of the substrate with a silicon precursor and a nitrogen precursor. In at least one deposition cycle a sequential plasma pretreatment is conducted prior to contacting the substrate with the silicon precursor. In some embodiments the sequential plasma pretreatment is conducted in every deposition cycle. The sequential plasma pretreatment comprises a first hydrogen plasma treatment step and a subsequent second nitrogen plasma treatment, as described in detail below. During the second nitrogen plasma treatment step the substrate is not exposed to hydrogen plasma.

Following the sequential plasma pretreatment, a silicon precursor contacts the substrate such that silicon species adsorb onto the surface of the substrate. In some embodiments, the silicon species may be same as the silicon precursor, or may be modified in the adsorbing step, such as by losing one or more ligands. The substrate is then contacted with a nitrogen precursor that reacts with the adsorbed silicon species to form silicon nitride. In some embodiments the nitrogen precursor comprises nitrogen plasma, such as a plasma generated in gas comprising $N_2$. In some embodiments, the nitrogen precursor can be a non-plasma reactant. In some embodiments a nitrogen precursor is provided sequentially after the silicon precursor in a deposition cycle. In some embodiments the nitrogen precursor is a nitrogen plasma from a sequential plasma pretreatment in a subsequent deposition cycle. That is, in some embodiments a nitrogen reactant may not be provided after the silicon precursor in a deposition cycle, and the nitrogen plasma from a sequential plasma treatment in a subsequent deposition cycle reacts with the adsorbed silicon precursor to form silicon nitride.

Although referred to as a plasma pretreatment step, in some embodiments a plasma pretreatment may be carried out following the SiN deposition phase (or silicon reactant exposure) in one or more deposition cycles, such that the plasma pretreatment step prepares the substrate surface for the silicon nitride deposition phase of a following deposition cycle. For example, a SiN deposition cycle may comprise a SiN phase in which SiN can be initially formed by a thermal ALD step, followed by the plasma pretreatment phase. The plasma pretreatment phase thus prepares the substrate surface for the SiN deposition phase of a following SiN deposition cycle. In some embodiments the subsequent plasma treatment may comprise exposing the substrate to sequential hydrogen and nitrogen plasma treatment steps, as described herein.

In some embodiments, in one or more deposition cycles the complete SiN deposition cycle comprises a sequential plasma pretreatment phase, and a SiN deposition phase. As discussed above, the sequential plasma pretreatment phase is typically followed by a SiN deposition phase, but in some embodiments the SiN deposition phase precedes the sequential plasma pretreatment phase. The sequential plasma pretreatment phase comprises exposing the substrate to treatment with hydrogen plasma followed by treatment with nitrogen plasma in the absence of hydrogen plasma. As mentioned briefly above, and without being limited to any particular mode of activity, with respect to deposition on three-dimensional structures it is believed that hydrogen plasma treatment can increase reactive —H terminated sites across the entire surface of the three-dimensional structure. Subsequent nitrogen plasma treatment (in the absence of hydrogen plasma) can eliminate the —H terminated sites preferentially from more accessible portions of the three-dimensional structure, such as the upper portion or top portion of a side wall in a trench. Because —H terminated sites remain preferentially at less accessible portions, such as the bottom portion of the three dimensional structure, adsorption of the silicon precursor in subsequent ALD cycles is enhanced at more accessible portion relative to the less accessible portion, such as at the bottom of the three-dimensional structure relative to the top portion. Consequently, the SiN growth rate is faster at the bottom and slower at the top of the feature. By controlling the plasma treatment, such as by utilizing low power or short duration nitrogen plasma treatment following hydrogen plasma treatment, the methods can realize deposition of highly conformal SiN films, and can even be used to form SiN films that are thicker at the bottom of a feature and thinner at the top (>100% side wall conformality).

In some embodiments, plasma enhanced ALD (PEALD) processes are used to deposit SiN films on a substrate in a reaction space. Briefly, a substrate or workpiece is placed in a reaction chamber and subjected to one or more deposition cycles comprising alternately repeated surface reactions. A sequential plasma pretreatment phase comprising sequential hydrogen and nitrogen plasma treatment steps is carried out in at least one deposition cycle prior to contacting the substrate with the silicon precursor. The sequential plasma pretreatment is followed by a silicon species deposition phase in which the substrate is contacted with a silicon precursor or a silicon nitride deposition phase in which the substrate is contacted sequentially with a silicon precursor and a nitrogen precursor.

In some embodiments the silicon precursor deposition or SiN deposition portion of the deposition cycle, also referred to as the silicon species deposition or SiN deposition phase, comprises contacting the substrate with a silicon precursor, such as a silicon hydrohalide precursor. In some such embodiments, in a silicon species deposition phase the silicon precursor adsorbs on the substrate surface and a nitrogen reactant in a subsequent deposition cycle (such as nitrogen plasma in the plasma pretreatment phase of a subsequent deposition cycle) reacts with the adsorbed silicon precursor to form silicon nitride.

In some embodiments, the SiN deposition portion of each ALD cycle comprises at least two distinct phases in which the substrate is alternately and sequentially contacted first with a silicon precursor, such as a silicon hydrohalide, and subsequently with a nitrogen precursor. In this regard, the provision and removal of a reactant or byproducts from the reaction space may be considered a phase. In a first phase, a first reactant comprising silicon is provided and forms no more than about one monolayer of silicon species on the substrate surface. This reactant may also be referred to as "the silicon precursor," "silicon-containing precursor," or "silicon reactant".

A number of suitable silicon precursors can be used in the presently disclosed PEALD processes. According to some embodiments the silicon precursor comprises a halide, such as I or Cl. In some embodiments, a silicon precursor comprises $SiI_4$, $HSiI_3$, $H_2SiI_2$, $H_3SiI$, $Si_2I_6$, $HSi_2I_5$, $H_2Si_2I_4$, $H_3Si_2I_3$, $H_4Si_2I_2$, $H_5Si_2I$, or $Si_3I_8$. In some embodiments, the silicon precursor comprises one of $HSiI_3$, $H_2SiI_2$, $H_3SiI$, $H_2Si_2I_4$, $H_4Si_2I_2$, and $H_5Si_2I$. In some embodiments the silicon precursor comprises two, three, four, five or six of $HSiI_3$, $H_2SiI_2$, $H_3SiI$, $H_2Si_2I_4$, $H_4Si_2I_2$, and $H_5Si_2I$, including any combinations thereof. In certain embodiments, the Si precursor comprises $H_2SiI_2$. In some embodiments, a silicon precursor comprises $SiCl_4$, $HSiCl_3$, $H_2SiCl_2$, or $Si_2Cl_6$.

In a second phase of the SiN deposition phase of a deposition cycle, a second reactant is provided and converts adsorbed silicon species to silicon nitride. In some embodiments the second reactant comprises a nitrogen precursor. In some embodiments, the second reactant comprises an excited nitrogen species. In some embodiments the second reactant comprises a non-plasma nitrogen reactant such as $NH_3$. In some embodiments the second reactant is not a nitrogen precursor. In some embodiments, the second reactant comprises hydrogen plasma.

In some embodiments the second reactant comprises a species from a nitrogen-containing plasma. In some embodiments, the second reactant comprises nitrogen radicals, nitrogen atoms and/or nitrogen plasma. In some embodiments, the second reactant may comprise nitrogen-containing plasma or a plasma comprising nitrogen. In some embodiments, the second reactant may comprise a plasma comprising nitrogen-containing species. In some embodiments the second reactant may comprise nitrogen atoms and/or N*radicals.

The second reactant may comprise other species that are not nitrogen precursors. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form.

As discussed in more detail below, in some embodiments a gas that is used to form a plasma, such as a gas comprising $N_2$, may flow constantly throughout the deposition process but only be activated intermittently, or flow at certain steps in the deposition cycle.

One or more of the first and second reactants may be provided with the aid of a carrier gas, such as $N_2$, $H_2$, Ar or He. In some embodiments the silicon precursor and the second reactant are provided with the aid of a carrier gas. In some embodiments the first reactant is provided with a carrier gas and the carrier gas also serves as a source gas for a second plasma reactant. For example, $N_2$ gas may be used as a carrier gas for the first silicon reactant, the $N_2$ gas may continue to flow to purge excess silicon precursor from the reaction space, and a plasma may subsequently be generated in the flowing $N_2$ gas to form the second reactant. Finally, the plasma may be extinguished and the flowing $N_2$ gas may serve to purge the reaction space of excess second reactant and reaction byproducts, if any.

In some embodiments, two of the phases of the SiN deposition phase may overlap, or be combined. For example, the silicon precursor and the second reactant may be provided simultaneously in pulses that partially or completely overlap. In addition, although referred to as the first and second phases, and the first and second reactants, the order of the phases may be varied, and an ALD cycle may begin with any one of the first and second phases. That is, unless specified otherwise, the first and second reactants can be provided in any order, and the process may begin with any of the reactants.

In some embodiments for depositing a silicon nitride film, one or more SiN deposition phases begin with provision of the silicon precursor, followed by the second reactant. In other embodiments deposition may begin with provision of the second reactant, followed by the silicon precursor.

As mentioned above, in some embodiments the SiN deposition cycle may comprise a silicon species deposition phase, in which only the first phase or a SiN deposition phase is carried out, in which the substrate is exposed to a silicon precursor. The nitrogen reactant that converts adsorbed silicon species to SiN may be provided in a plasma pretreatment phase in a subsequent deposition cycle.

In one or more deposition cycles, a sequential plasma pretreatment phase is carried out. In some embodiments the sequential plasma pretreatment phase is carried out prior to the SiN deposition phase. The sequential plasma pretreatment comprises a first plasma treatment step in which the substrate is exposed to hydrogen plasma and a subsequent second plasma treatment step in which the substrate is exposed to nitrogen plasma in the absence of hydrogen plasma. As discussed below, in some embodiments the plasma pretreatment phase is carried out prior to the SiN deposition portion of the deposition cycle. In some embodiments the plasma pretreatment phase is carried out prior to contacting the substrate with a silicon precursor in each deposition cycle. In some embodiments the plasma pretreatment phase is carried out prior to contacting the substrate with the silicon precursor in one or more deposition cycles.

In some embodiments the first plasma treatment step comprises exposing the substrate to a first hydrogen plasma. This can be referred to as the first hydrogen plasma treatment step. In some embodiments the first plasma treatment step comprises exposing the substrate to a hydrogen plasma and a nitrogen plasma.

In some embodiments the second plasma treatment step comprises exposing the substrate to a nitrogen plasma in the absence of hydrogen plasma. This may be referred to as the nitrogen plasma treatment step. In some embodiments the second plasma treatment step is carried out for a short duration and at low power.

In some embodiments the first plasma treatment step may comprise exposing the substrate to a hydrogen and nitrogen plasma, such that the nitrogen plasma reacts with silicon precursor adsorbed on the substrate in a prior deposition cycle, resulting in the formation of silicon nitride.

The entire SiN deposition cycle is repeated until a film of the desired thickness and composition is obtained. In some embodiments, the plasma pretreatment parameters, such as the power and time of application of the plasma reactants may be varied in one or more plasma treatment steps in order to obtain a film with the desired characteristics.

The SiN deposition, including the sequential plasma pretreatment phase and the silicon species deposition phase or SiN deposition phase may be carried out in an appropriate deposition reactor. In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP, XP8 and Dragon®. Exemplary batch ALD reactors, designed specifically to enhance ALD processes, are commercially available from and ASM Europe B.V (Almere, Netherlands) under the tradenames A400™ and A412™.

In some embodiments, the exposed surfaces of the workpiece can be pretreated prior to the first SiN deposition cycle to provide desired reactive sites on the surface. In some embodiments a separate pretreatment step is not required. In some embodiments the substrate is pretreated to provide a desired surface termination. In some embodiments the substrate is pretreated with plasma.

In some embodiments, excess reactant and reaction byproducts, if any, are removed from the vicinity of the substrate, and in particular from the substrate surface, between each reactant pulse and between plasma treatment steps. In some embodiments the reaction chamber is purged between reactant pulses and between plasma treatment steps by purging with an inert gas. In some embodiments, one or more reactants and/or reaction byproducts can be removed with a purge gas, such as a $N_2$ or $H_2$ gas. The flow rate and time of each reactant, is tunable, as is the removal step, allowing for control of the quality and various properties of the films.

As mentioned above, in some embodiments a gas is provided to the reaction chamber at specific times in the deposition cycle, continuously during each deposition cycle, or during the entire ALD process, and certain reactive species are provided by generating a plasma in the gas, either in the reaction chamber or upstream of the reaction chamber. In some embodiments the gas comprises nitrogen. In some embodiments the gas comprises $N_2$. The flowing gas may also serve as a purge gas. For example, flowing nitrogen may serve as a both a carrier gas and a purge gas for a first silicon precursor and also serve as a second reactant (as a source of reactive species), as well as a source gas for the nitrogen plasma treatment step in the pretreatment phase.

The term "pulse" may be understood to comprise feeding reactant into the reaction chamber for a predetermined amount of time. The term "pulse" does not restrict the length or duration of the pulse and a pulse can be any length of time.

In some embodiments one or more deposition cycles comprise both a sequential plasma pretreatment phase and a SiN deposition phase. In some embodiments the sequential plasma pretreatment process phase occurs before the SiN deposition cycle. In some embodiments the SiN deposition phase occurs before the plasma pretreatment phase. The entire SiN deposition cycle may be repeated two or more times to form a SiN film with the desired characteristics.

In some embodiments the silicon nitride deposition cycle comprises alternately and sequentially contacting the substrate surface with a silicon precursor and a nitrogen precursor. In some embodiments the nitrogen precursor is provided separately from the nitrogen plasma in the plasma pretreatment process. However, in some embodiments the silicon nitride deposition cycle may comprise contacting the substrate with a silicon precursor and the nitrogen plasma from the plasma pretreatment process, either in a subsequent deposition cycle or in the same deposition cycle, reacts with the adsorbed silicon precursor to form silicon nitride.

In some embodiments, in the silicon nitride deposition cycle, the silicon reactant is provided first. After an initial surface termination, if necessary or desired, a first silicon reactant pulse is supplied to the workpiece. In accordance with some embodiments, the first reactant pulse comprises a carrier gas flow and a volatile silicon species, such as silicon-hydrohalide (for example, $H_2SiI_2$), that is reactive with the workpiece surfaces of interest. Accordingly, the silicon reactant adsorbs upon these workpiece surfaces. The first reactant pulse self-saturates the workpiece surfaces such that any excess constituents of the first reactant pulse do not further react with the molecular layer formed by this process.

The first silicon reactant pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon reactant pulse is from about 0.05 seconds to about 5.0 seconds, about 0.1 seconds to about 3 seconds or about 0.2 seconds to about 1.0 seconds. The optimum pulsing time can be readily determined by the skilled artisan based on the particular circumstances.

After sufficient time for a molecular layer of silicon species to adsorb on the substrate surface, excess first silicon reactant is then removed from the reaction space. In some embodiments the excess first reactant is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of inert gas, such as nitrogen or argon, that is flowing throughout the ALD cycle.

In some embodiments, the first reactant is purged for about 0.1 seconds to about 10 seconds, about 0.3 seconds to about 5 seconds or about 0.3 seconds to about 1 second. Provision and removal of the silicon reactant can be considered the first or silicon phase of the ALD cycle.

In the second phase, a second nitrogen precursor, such as nitrogen plasma, is provided to the reaction space and contacts the substrate. Nitrogen plasma may be formed by generating a plasma in a gas comprising nitrogen in the reaction chamber or upstream of the reaction chamber, for example by flowing the nitrogen source gas through a remote plasma generator. As discussed above, in some embodiments the nitrogen plasma from the plasma pretreatment process in a subsequent deposition cycle serves as the nitrogen reactant.

Typically, the second reactant, for example comprising nitrogen plasma, is provided for about 0.1 seconds to about 10 seconds. In some embodiments the second reactant, such as nitrogen plasma, is provided for about 0.1 seconds to about 10 seconds, 0.5 seconds to about 5 seconds or 0.5 seconds to about 2.0 seconds. However, depending on the reactor type, substrate type and its surface area, the second reactant pulsing time may be even higher than about 10 seconds. In some embodiments, pulsing times can be on the order of minutes. The optimum pulsing time can be readily determined by the skilled artisan based on the particular circumstances.

After a time period sufficient to completely saturate and react the previously adsorbed molecular layer of silicon species with the nitrogen reactant pulse, excess reactant and reaction byproducts may be removed from the reaction space. As with the removal of the first reactant, this step may comprise stopping the generation of reactive species and continuing to flow the inert gas, such as nitrogen, for a time period sufficient for excess reactive species and volatile reaction by-products to diffuse out of and be purged from the reaction space. In other embodiments a separate purge gas may be used. The purge may be, in some embodiments, from about 0.1 seconds to about 10 seconds, about 0.1 seconds to about 4 seconds or about 0.1 seconds to about 0.5 seconds. Together, the nitrogen reactant provision and removal represent a second, nitrogen phase in a silicon nitride atomic layer deposition cycle.

While the SiN deposition process phase is generally referred to herein as beginning with the silicon precursor, it is contemplated that in other embodiments the cycle may begin with the nitrogen precursor. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the silicon phase. Thus, as mentioned above, in some embodiments a nitrogen plasma from the plasma pretreatment phase may serve as the nitrogen reactant to react with adsorbed silicon precursor to form silicon nitride. In some embodiments one or more different ALD cycles are provided in the deposition process.

The alternate and sequential contacting of the substrate with the silicon reactant and the nitrogen reactant can be repeated one or more times in each complete SiN deposition cycle.

In one or more of the deposition cycles, a plasma pretreatment phase comprising first and second plasma treatment steps is carried out in which the substrate is sequentially contacted with a hydrogen plasma and then with a nitrogen plasma in the absence of hydrogen plasma. In some embodiments the first and second plasma treatment steps are carried out in each SiN deposition cycle. In some embodiments the plasma pretreatment is carried out in one, two or more deposition cycles in the deposition process. In some embodiments the plasma pretreatment is carried out in each SiN deposition cycle. In some embodiments the plasma pretreatment (including first and second plasma treatment steps) is carried out in deposition cycles at a specific interval in the deposition process, such as every 2, 3, 4, 5, 6, 7, 8, 9, 10, etc . . . deposition cycles. In some embodiments the plasma pretreatment phase is carried out prior to the SiN deposition phase in one or more deposition cycles. In some embodiments the plasma pretreatment phase is carried out prior to the SiN deposition phase in each SiN deposition cycle.

The first plasma treatment step may comprise contacting the substrate with a first hydrogen plasma for a first duration of time. In some embodiments the first plasma treatment step comprises exposing the substrate to both a hydrogen and nitrogen plasma. The hydrogen plasma may be generated in a hydrogen source gas, such as $H_2$ gas, a gas comprising $H_2$, or $NH_3$ gas.

In some embodiments, the first hydrogen plasma treatment can be carried out for a duration of time of about 0.1 seconds to about 10 seconds, 0.5 seconds to about 5 seconds or 0.5 seconds to about 2.0 seconds.

In some embodiments, the first plasma treatment step may also provide a nitrogen reactant, such as nitrogen plasma. In some embodiments the nitrogen reactant may react with adsorbed silicon precursor from a prior deposition cycle to form SiN. A separate nitrogen precursor to react with the silicon precursor in the SiN deposition phase may thus be omitted in one or more deposition cycles (such that the SiN deposition phase may be characterized as a silicon species deposition phase). For example, in some embodiments after exposure to the silicon reactant, a subsequent deposition cycle may begin with a plasma pretreatment step comprising a first plasma treatment in which the substrate is contacted with plasma generated in flowing source gas comprising both $H_2$ and $N_2$ gases, such that the nitrogen plasma reacts with adsorbed silicon to form SiN.

In some embodiments gases comprising hydrogen and/or nitrogen, such as $H_2$ and $N_2$, are provided to the reaction chamber before the plasma is ignited or nitrogen and hydrogen atoms or radicals are formed. In some embodiments a hydrogen and/or nitrogen plasma is generated remotely and provided to the reaction chamber.

Subsequent to the first plasma treatment step a second plasma treatment step is carried out for a second duration of time. The second plasma treatment step comprises contacting the substrate with a nitrogen plasma in the absence of hydrogen plasma. The nitrogen plasma is generated in nitrogen-containing source gas, such as $N_2$ gas or a gas comprising $N_2$. In some embodiments the plasma is generated in $N_2$ gas. However, during the second plasma treatment the substrate is not contacted with a hydrogen plasma. Thus, the nitrogen source gas in which the plasma is generated comprises nitrogen but not hydrogen. In some embodiments the nitrogen plasma is generated in the reaction space. In some embodiments the nitrogen plasma is generated remotely and provided to the reaction space.

In some embodiments the second plasma treatment step is carried out for about 0.1 seconds to about 10 seconds, 0.5 seconds to about 5 seconds or 0.5 seconds to about 2.0 seconds. In some embodiments, the second nitrogen plasma treatment step can be carried out for a duration of time that is shorter than the duration of the first hydrogen plasma treatment step.

Nitrogen and hydrogen plasma may be generated by applying radiofrequency (RF) power of from about 10 W to about 2000 W, preferably from about 50 W to about 1000 W, more preferably from about 300 W to about 550 W in some embodiments. In some embodiments the RF power density may be from about 0.02 $W/cm^2$ to about 2.0 $W/cm^2$, preferably from about 0.05 $W/cm^2$ to about 1.5 $W/cm^2$. The RF power may be applied to a source gas that flows during the specific plasma pulse time, or that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the between the susceptor and showerhead plate is from about 0.1 cm to about 20 cm, from about 0.5 cm to about 5 cm, or from about 0.8 cm to about 3.0 cm.

In some embodiments, the hydrogen plasma used in the first plasma treatment step can be generated by applying RF power of from about 10 W to about 2000 W to a hydrogen source gas. In some embodiments the hydrogen plasma is generated using a power of about 550 W.

In some embodiments, the nitrogen plasma used in the second plasma treatment step is generated by applying RF power of about 10 W to about 2000 W to a nitrogen-containing source gas. In some embodiments the nitrogen plasma is generated using a power of about 300 W.

In some embodiments the nitrogen plasma used in the second plasma treatment step is generated using a lower power than the power that is used to generate the hydrogen plasma in the preceding first hydrogen plasma treatment step. For example, in some embodiments the hydrogen plasma in the first plasma treatment step is generated using a power of about 500 W and the nitrogen plasma in the second plasma treatment is generated using a power of about 300 W. In some embodiments a lower plasma power, such as about 300 W, is used for both the first and second plasma treatment steps.

According to some embodiments, the deposition cycles may be performed at temperatures ranging from about 25° C. to about 700° C., preferably from about 50° C. to about 600° C., more preferably from about 100° C. to about 500° C., and most preferably from about 200° C. to about 400° C. In some embodiments, the optimum reactor temperature may be limited by the maximum allowed thermal budget. Therefore, in some embodiments the reaction temperature is from about 300° C. to about 400° C. In some applications, the maximum temperature is around about 400° C., and, therefore the deposition process is run at that reaction temperature.

According to some embodiments of the present disclosure, the pressure of the reaction chamber during processing is maintained at from about 0.01 torr to about 50 torr, preferably from about 0.1 torr to about 30 torr. In some embodiments, the pressure is maintained at 0.1 torr. In some embodiments, the pressure is maintained at 10 torr. In some embodiments, the pressure is maintained at 15 torr. In some embodiments, the pressure is maintained at 20 torr. In some embodiments, the pressure is maintained at 25 torr. In some embodiments, the pressure is maintained at 30 torr.

Although embodiments described herein refer to PEALD deposition of silicon nitride films, it will be understood that as disclosed herein in some embodiments a non-plasma second nitrogen reactant may be used. However, at least one deposition cycle comprises the first and second plasma treatment steps.

Figure 2:
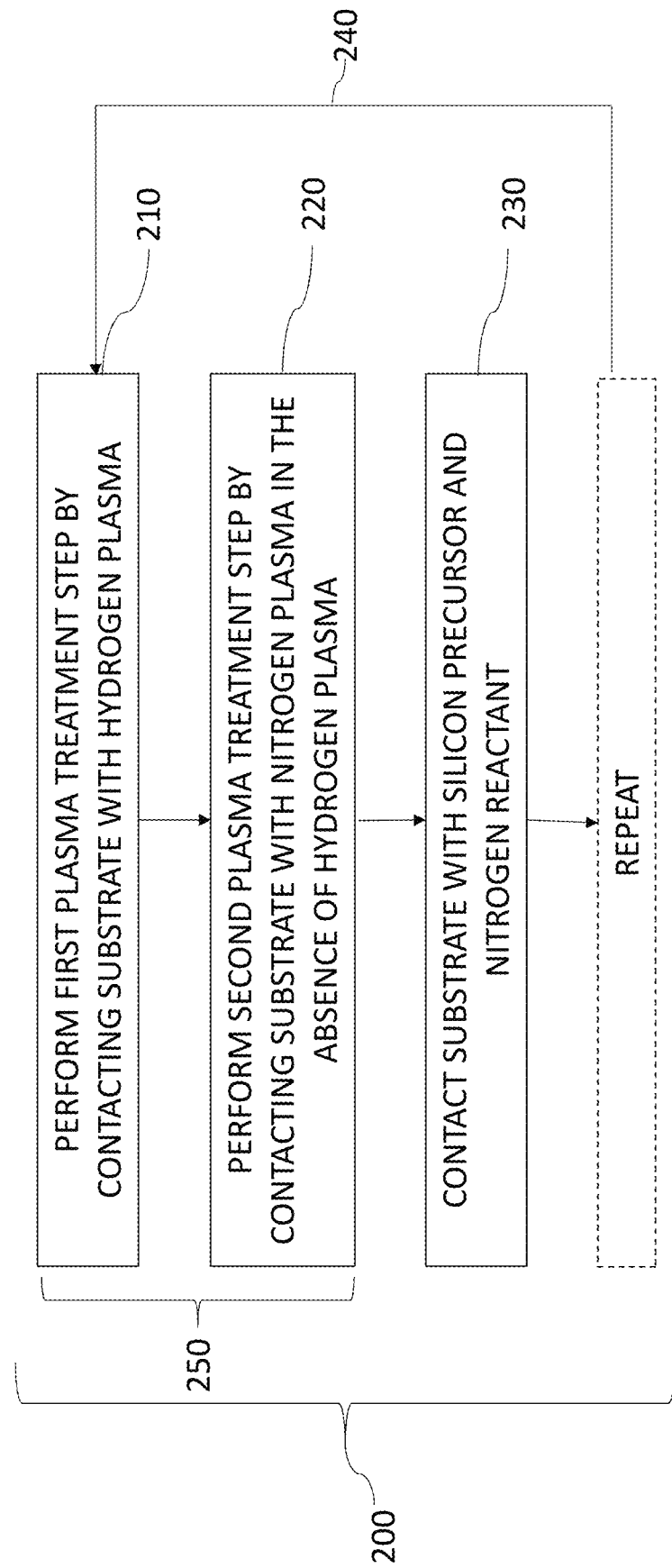
FIG. 2 is a flow chart generally illustrating a method of forming a silicon nitride film by a PEALD process in accordance with some embodiments utilizing a sequential plasma pretreatment in each deposition cycle.

FIG. 2 is a flow chart generally illustrating an exemplary deposition process for forming a SiN thin film in accordance with some embodiments. According to certain embodiments, a silicon nitride thin film is formed on a substrate by a deposition process comprising multiple silicon nitride deposition cycles, one or more silicon nitride deposition cycles 200 comprising performing a sequential plasma pretreatment 250 followed by silicon nitride deposition 230. In some embodiments the sequential plasma pretreatment 250 comprises:

(1) performing a first plasma treatment step 210 comprising contacting the substrate with hydrogen plasma;

(2) performing a second plasma treatment step 220 comprising contacting the substrate with nitrogen plasma in the absence of hydrogen plasma; The sequential plasma pretreatment 250 is followed by the silicon nitride deposition phase, which comprises:

(3) alternately and sequentially contacting the substrate with a vapor phase silicon precursor and a nitrogen precursor 230 such that silicon species adsorb on the substrate surface and are converted to silicon nitride.

Excess reactants and reaction byproducts, if any, may be removed from the vicinity of the substrate after each step, for example by purging with an inert gas, such as Ar, $N_2$ or $H_2$ gas. Plasma pretreatment process 250 can provide a pre-treatment surface before the SiN deposition process phase 230. The plasma pretreatment phase 250 and the SiN deposition phase can be repeated 240 two or more times such that SiN thin film having desired properties and a desired thickness is deposited.

In some embodiments the sequential plasma pretreatment phase 250 comprising steps 210 and 220 may be included in every deposition cycle, while in some embodiments the sequential plasma pretreatment phase 250 comprising steps 210 and 220 is included only in certain deposition cycles. For example, the sequential plasma pretreatment phase 250 comprising steps 210 and 220 may be included every 1, 2, 3, 5, 10, 15, 20 or more deposition cycles.

As discussed above, in some embodiments the silicon nitride deposition phase 230 comprises only contacting the substrate with a silicon precursor and not with a nitrogen precursor, such that adsorbed silicon precursor reacts with nitrogen plasma from the sequential plasma pretreatment phase 250 in a subsequent deposition cycle to form silicon nitride.

As discussed herein, the silicon precursor may be a hydrohalide silicon precursor. In some embodiments, the silicon species adsorbed on the substrate surface can be chemically different from the silicon precursor that is provided to the reaction space. In some embodiments, the silicon species can be substantially the same as the silicon precursor.

In some embodiments the nitrogen plasma may be formed by generating a plasma in a gas comprising $N_2$.

In some embodiments, the first plasma treatment step 210 comprises contacting the substrate with a plasma generated in a hydrogen source gas, such as $H_2$ gas, a gas comprising $H_2$, or a gas comprising $NH_3$. In some embodiments, the substrate is contacted with the hydrogen plasma from about 0.1 seconds to 20 seconds. For example, the substrate is contacted with the hydrogen plasma for 0.1 seconds, 1 second, 5 seconds, 10 seconds, 15 seconds or 20 seconds.

In some embodiments, the first hydrogen plasma treatment step 210 can be carried out for a duration of time of about 1 second to 10 seconds. In some embodiments, the first hydrogen plasma treatment step is carried out for a duration of 1 second, 2 seconds, 5 seconds, 7 seconds, or up to 10 seconds. In some embodiments, the first hydrogen plasma treatment step 210 can be carried out for a duration of about 1 seconds to 10 seconds. In some embodiments, the first hydrogen plasma treatment step is carried out for a duration of 1 second. In some embodiments, the first hydrogen plasma treatment step is carried out for about 5 seconds. In some embodiments, the first hydrogen plasma treatment step is carried out for about 10 seconds.

In some embodiments, the hydrogen plasma can be generated by applying RF power to the hydrogen source gas. The plasma may be generated using a power from about 10 W to about 2000 W. In some embodiments the hydrogen plasma is generated using a power of about 550 W.

In some embodiments, during the first hydrogen plasma treatment 210 the substrate can also be contacted with nitrogen plasma, as discussed in more detail below with reference to FIG. 4 and FIG. 5. For example, the substrate may be contacted with a plasma formed in a gas comprising nitrogen and hydrogen. In some embodiments the nitrogen plasma reactants may react with silicon precursor previously adsorbed on the substrate in a prior deposition cycle to form SiN.

In some embodiments the second plasma treatment step 220 comprises contacting the substrate with a plasma generated in a nitrogen-containing source gas. For example, the nitrogen-containing source gas can be $N_2$ gas or can comprise $N_2$. However, in the second plasma treatment step 220 the substrate is not contacted with a hydrogen plasma. Thus, the nitrogen source gas in which the plasma is generated comprises nitrogen but not hydrogen. In some embodiments the plasma is generated in $N_2$ gas. Further, prior to conducting the second plasma treatment step 220 any residual hydrogen plasma from the first plasma treatment step 210 is removed from the reaction space.

In some embodiments, the nitrogen plasma used in the second plasma treatment step 220 is generated by applying RF power to the nitrogen-containing source gas. In some embodiments the nitrogen plasma may be generated using a power from about 10 W to about 2000 W. However, in some embodiments the nitrogen plasma is generated using a lower power than the power that is used to generate the hydrogen plasma in the hydrogen plasma treatment step. For example, in some embodiments the hydrogen plasma in the first hydrogen plasma treatment step 210 is generated using a power of about 550 W and the nitrogen plasma in the second plasma treatment step 220 is generated using a power of about 300 W.

In some embodiments the second nitrogen plasma treatment step 220 can be carried out for a duration of time of about 0.1 seconds to 20 seconds. For example, the second nitrogen plasma treatment can be carried out for 0.1 seconds, for 1 second, for 5 seconds, for 10 seconds, for 15 seconds, or for 20 seconds. In some embodiments, the second nitrogen plasma treatment step 220 can be carried out for a duration of time that is shorter than the duration of time for the first plasma treatment step 210. In some embodiments, the second nitrogen treatment step 220 is carried out for about the same time as the first plasma treatment step 210. In some embodiments, the second nitrogen plasma treatment step 220 can be carried out for a duration that is longer than the duration of time for the first plasma treatment step 210.

As mentioned above, in some embodiments, an inert gas can flow throughout part or all of the deposition cycle and can serve one or more purposes. For example, in some embodiments the inert gas can serve a carrier gas and/or source gas for one or more reactants, such as the silicon reactant. In some embodiments the inert gas can serve as a purge gas for removing excess reactant and/or reaction byproducts between one or more steps in the deposition cycle. In some embodiments the inert gas can serve as a source gas for generating one or more of the plasma reactants, such as nitrogen plasma. For example, in some embodiments a $N_2$ gas can flow throughout the deposition cycle, or at certain points in the deposition cycle. In some embodiments the $N_2$ gas is flowed throughout the deposition cycle, with a plasma being generated to create nitrogen plasma for the second plasma treatment. The $N_2$ gas can also serve as a source gas for the nitrogen reactant in the SiN deposition phase 230 and can even serve as a carrier gas for the silicon precursor. In some embodiments $N_2$ gas is flowed throughout the deposition cycle and a plasma is generated in the $N_2$ gas only during the second plasma treatment step. In some embodiments, the inert gas is not flowed in certain steps in the deposition process. For example, in some embodiments $H_2$ gas is used as the inert gas and $H_2$ gas is not flowed during the nitrogen plasma treatment step but is flowed throughout the other steps in the deposition cycle. A plasma may be generated in the flowing $H_2$ gas during the first plasma treatment step.

Figure 3:
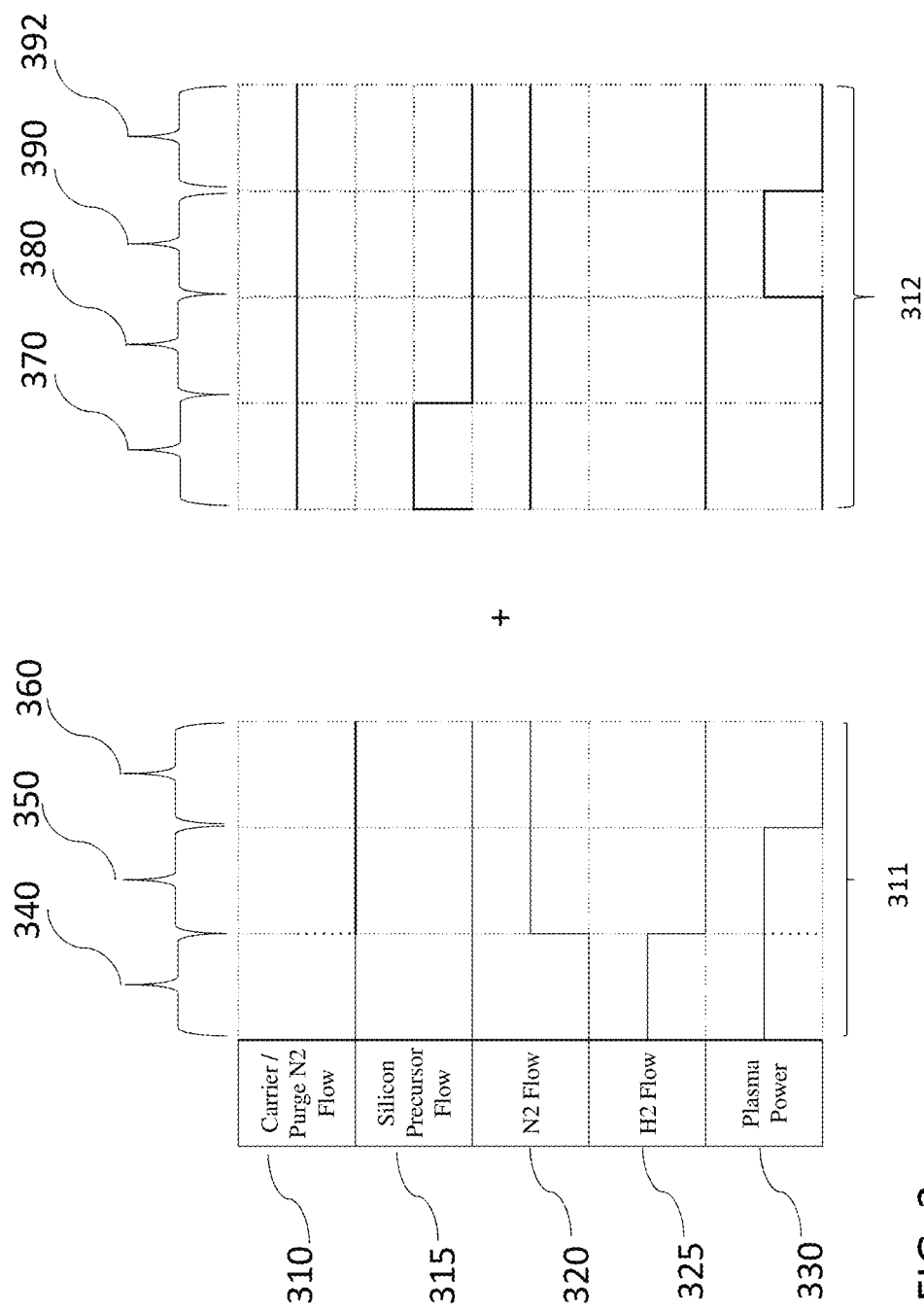
FIG. 3 is a chart illustrating gas flow and plasma power in a deposition cycle for forming a silicon nitride film in accordance with some embodiments utilizing a sequential plasma pretreatment. In the depicted deposition cycle, a sequential plasma pretreatment phase 311 comprises exposure to a hydrogen plasma for a first period 340 followed by exposure to a nitrogen plasma in the absence of hydrogen plasma for a second period 350. Following the sequential plasma pretreatment phase 311, a SiN deposition phase 312 comprises exposure to silicon precursor 370 followed by a silicon precursor purge step 380, exposure to nitrogen plasma 390 and nitrogen plasma purge step 392. Flowing nitrogen gas 310 can serve as a carrier gas for the silicon precursor and as a purge gas in steps 380 and 392.

FIG. 3 illustrates the pulsing of reactants and application of plasma power in a SiN deposition cycle in accordance with some embodiments. The illustrated deposition cycle includes a plasma pretreatment phase 311 and a silicon nitride deposition phase 312. $N_2$ is flowed 310 as a purge gas and/or carrier gas throughout the deposition cycle.

The plasma pretreatment phase 311 comprises steps 340, 350 and 360. The first hydrogen plasma treatment 340 comprises flowing $H_2$ gas 325 into the chamber while a plasma power 330 is applied. Plasma power 330 is turned on during this period, creating a plasma in the flowing $H_2$ gas 325. At the end of the hydrogen plasma exposure period 340, $H_2$ flow is turned off, and nitrogen flow 320 is turned on. The nitrogen plasma treatment 350 comprises flowing $N_2$ gas 320 into the reaction space while a plasma power 330 is applied. During the nitrogen plasma treatment step 350, the substrate is exposed to nitrogen plasma in the absence of hydrogen plasma. At the end of the nitrogen plasma treatment period 350 the plasma power 330 is turned off. At step 360, $N_2$ gas is flown into the reaction chamber to remove excess reactive species. Steps 340, 350, and 360 can optionally be repeated a plurality of times prior to the silicon nitride deposition phase 312. In addition, as discussed herein in some embodiments the plasma pretreatment phase 311 may follow the silicon nitride deposition phase 311.

Silicon nitride deposition phase 312 comprises steps 370, 380, 390 and 392. Step 370 comprises turning on the silicon precursor flow 315 to provide silicon precursor into the reaction chamber such that silicon species are adsorbed on the substrate surface. After silicon precursor is flowed into the reaction chamber 370, excess silicon precursor is purged from the chamber at step 380 by flowing purge $N_2$ purge gas 310. Following the silicon precursor purge 380, $N_2$ gas 320 is flowed into the reaction space and RF power is turned on at step 390 to form nitrogen plasma. The nitrogen plasma reacts with the adsorbed silicon precursor to form silicon nitride on the substrate surface. Subsequently, the plasma power is turned off and excess reactive species and any reaction byproducts are purged from the reaction space 392 by flowing $N_2$ gas 310. The silicon precursor may be provided with the aid of a carrier gas, such as $N_2$. $N_2$ flow may be maintained during steps 370, 380, 390 and 392, such that the $N_2$ serves as a source gas for nitrogen reactant and also aids in purging the reaction space. In some embodiments, following silicon nitride deposition phase 312, the silicon nitride deposition cycle is repeated. That is, sequential plasma pretreatment phase 311 and deposition cycle 312 can be repeated a number of times to form a desired SiN film. In some embodiments silicon nitride deposition phase 312 can be repeated a number of times prior to beginning the next silicon nitride deposition cycle. The plasma power 330 may be controlled to achieve a SiN film with desirable characteristics.

Figure 4:
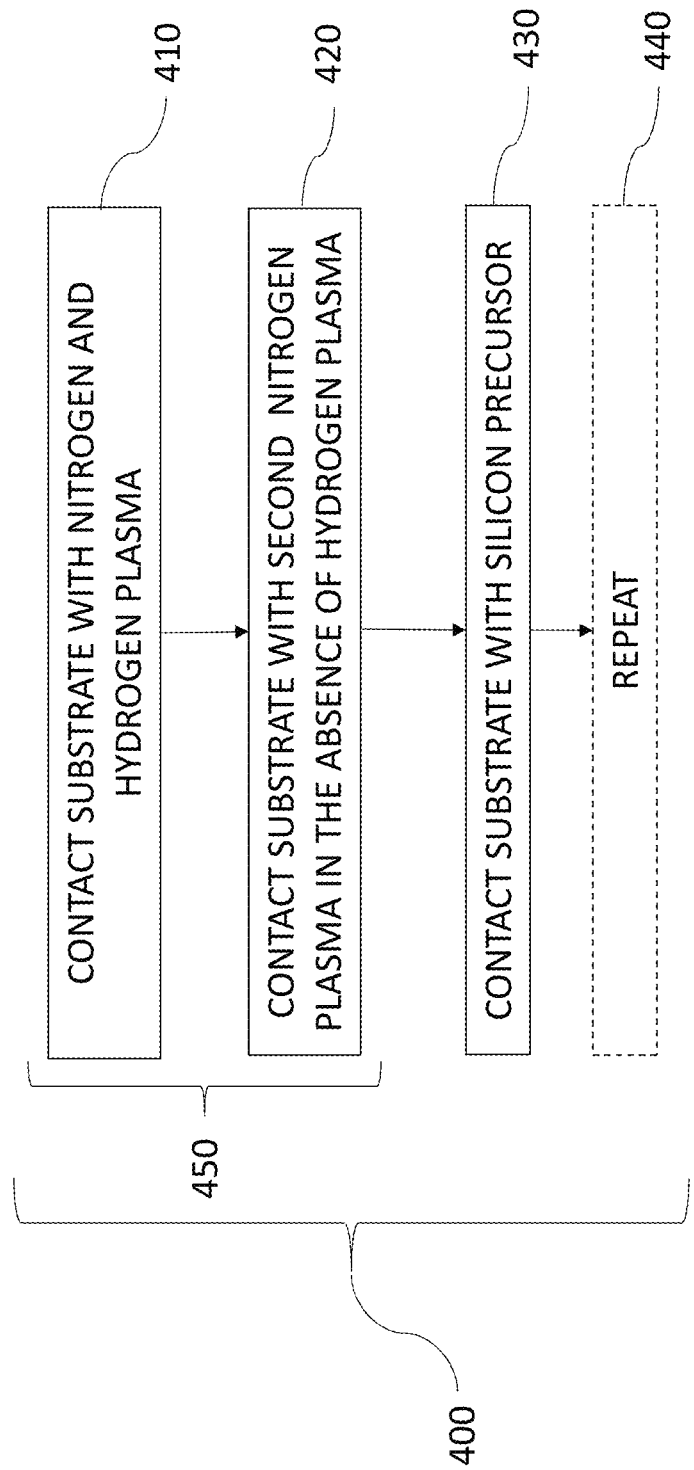
FIG. 4 is a flow chart illustrating a method of forming a silicon nitride film in accordance with some embodiments utilizing a sequential plasma pretreatment in each deposition cycle. In the illustrated method, the substrate is simultaneously contacted with a hydrogen and nitrogen plasma 410, and subsequently contacted with a second nitrogen plasma in the absence of hydrogen plasma 420 during the sequential plasma pretreatment phase 450. Following the sequential plasma pretreatment phase 450 the substrate is contacted with a silicon precursor in a silicon nitride deposition phase and the cycle may be repeated 440. Adsorbed silicon precursor may react with nitrogen plasma in the following deposition cycle to form silicon nitride. Alternatively, an additional step may be added to the deposition cycle in which the substrate is contacted with a nitrogen reactant after being contacted with the silicon precursor 430 and prior to starting the next deposition cycle.

FIG. 4 is a flow chart generally illustrating embodiments of a silicon-nitride deposition cycle in which the sequential plasma pretreatment phase 450 comprises a first step 410 in which the substrate is simultaneously contacted with a nitrogen plasma and a hydrogen plasma, such as by forming a plasma in a $N_2/H_2$ mixed gas. Following the plasma pretreatment phase 450 the substrate is subsequently contacted with a silicon precursor 430 in a silicon species deposition phase, such that silicon species are adsorbed on the substrate surface. The deposition cycle is repeated, and the nitrogen plasma in step 410 in a subsequent cycle reacts with adsorbed silicon species to form silicon nitride.

As illustrated in FIG. 4, a silicon nitride thin film can be formed on a substrate by multiple silicon nitride deposition cycles, one or more silicon nitride deposition cycles 400 comprising:
(1) contacting the substrate with a first nitrogen and hydrogen plasma 410;
(2) contacting the substrate with a second nitrogen plasma in the absence of hydrogen plasma 420;
(3) contacting the substrate with a silicon precursor 430; and
(4) repeating 440 steps 410-430.

Excess reactants may be removed from the vicinity of the substrate, for example, by purging from the reaction space with an inert gas, after each contacting step.

The plasma pretreatment phase 450 comprises contacting the substrate with nitrogen and hydrogen plasma 410 and contacting the substrate with a second nitrogen plasma in the absence of hydrogen plasma 420. The plasma pretreatment phase 450 may be repeated one or more times prior to contacting the substrate with the silicon precursor 430.

Following the plasma pretreatment phase 450, the substrate is contacted with a silicon precursor 430, such as a silicon hydrohalide precursor. Following step 430, deposition cycle may be repeated a number of times to form the desired SiN film. In some embodiments, the overall deposition cycle is repeated a number of times 440 sequentially to form a SiN film of the desired thickness and with the desired properties.

In some embodiments, the sequential plasma pretreatment 450 is not repeated in every deposition cycle.

In some embodiments, the first nitrogen and hydrogen plasma treatment in step 410 is generated using a first power and the second nitrogen plasma treatment in step 420 is generated using a second power. In some embodiments, the second power is less than the first power. In some embodiments, the second power is the same as the first power. In some embodiments the first power is 550 W and the second power is 300 W. In some embodiments the first and second power are both 300 W.

In some embodiments, in at least one deposition cycle the substrate is contacted with the first nitrogen and hydrogen plasma 410 for a first duration that is greater than a second duration during which the substrate is contacted with the second nitrogen plasma 440. In some embodiments, in at least one deposition cycle the substrate is contacted with the first nitrogen and hydrogen plasma 410 for a first duration that is shorter than a second duration during which the substrate is contacted with the second nitrogen plasma 420. In some embodiments the duration of the first nitrogen and hydrogen plasma step 410 is the same as the second nitrogen plasma step 420.

Figure 5:
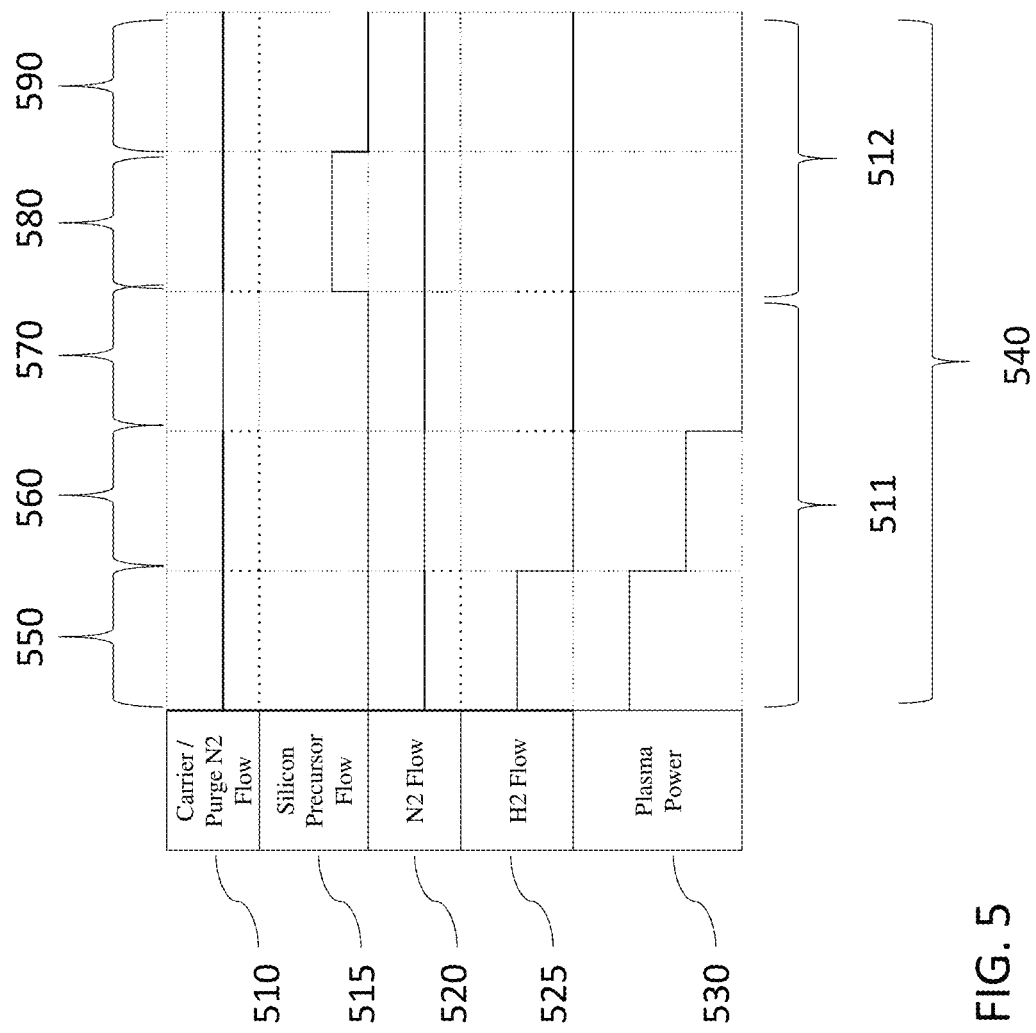
FIG. 5 is a chart illustrating gas flow and plasma power in a deposition cycle for forming a silicon nitride film in accordance with some embodiments utilizing a sequential plasma pretreatment in each deposition cycle. In the depicted deposition cycle, during the sequential plasma pretreatment phase 511 the substrate is simultaneously contacted with a hydrogen and nitrogen plasma during time period 550, subsequently contacted with a second nitrogen plasma in the absence of hydrogen plasma during time period 560, followed by a purge period 570 in which excess plasma reactant is removed by the aid of purge gas 510. The plasma pretreatment phase 511 is followed by a silicon nitride deposition phase 512 in which the substrate is contacted with a silicon precursor 515. Silicon precursor may be purged from the reaction space 590 with the aid of a flowing $N_2$ purge gas 510 prior to beginning the next deposition cycle.

FIG. 5 illustrates the pulsing of reactants and application of plasma power in a SiN deposition cycle in accordance with some embodiments in which the substrate is simultaneously exposed to hydrogen and nitrogen plasma during the first plasma step of the sequential plasma pretreatment.

A SiN deposition cycle 540 comprises a plasma pretreatment phase 511 and a silicon species deposition phase 512. In the plasma pretreatment phase 511 the substrate is exposed to a nitrogen and hydrogen plasma 550, followed by exposure to a nitrogen plasma in the absence of hydrogen plasma 560. At the silicon species deposition phase 512, the substrate is exposed to the silicon precursor such that silicon species are adsorbed to the substrate surface. However, the substrate is not exposed to the reactant N plasma during this phase, such that at the silicon species deposition phase 512 of the deposition cycle, SiN is not formed. However, in the following SiN deposition cycle 540, during the plasma pretreatment phase 511 when the substrate is exposed to nitrogen plasma, the nitrogen plasma reacts with adsorbed silicon species from the prior silicon precursor deposition phase 512 such that SiN is formed.

The plasma pretreatment phase 511 comprises steps 550, 560 and 570. Hydrogen 525 and nitrogen 520 gases flow into the reaction chamber during the first plasma step 550 and plasma power 530 is applied at a first power level and creates a plasma in the flowing $N_2$ and $H_2$ reactant gases 520, 525, such that the substrate is exposed to hydrogen and nitrogen plasma.

During the second plasma treatment step 560, $N_2$ reactant gas 520 continues to flow to the reaction space while the flow of $H_2$ gas 525 is stopped. Plasma power 530 is applied at a second level that is lower than in the first plasma treatment step 550, and generates a plasma in the flowing $N_2$ gas, such that the substrate is exposed to nitrogen plasma in the absence of hydrogen plasma.

$N_2$ gas may be used to purge the reaction space 570 of any remaining excited species after the plasma treatment steps 550 and 560.

The silicon species deposition phase 512 comprises steps 580 and 590. At step 580 a silicon reactant flow 515 is turned on and the silicon reactant is flowed into the reaction chamber with the aid of N₂ carrier gas 510 while the plasma power is turned off, such that silicon species adsorb on the substrate surface. During step 580, H₂ flow 525 and N₂ flow 520 are turned off. In subsequent deposition cycles, the nitrogen plasma generated during step 550 reacts with adsorbed silicon species to form SiN. At step 590, excess silicon precursor is purged.

The plasma pretreatment phase 511 and the silicon species deposition phase 512 may be repeated a number of times to form a SiN film of the desired thickness. The plasma power 530 may be controlled to achieve a SiN film with desirable characteristics.

Example

FIGS. 6A and 6B illustrate STEM images of SiN films deposited on structures having an AR of 10 according to some embodiments of the present disclosure. Sidewall conformality of >200% was obtained (FIG. 6A), and a structure with only a small seam is obtained in a gap fill process (FIG. 6B). Specifically, the SiN deposition was carried out at 400° C. while the reaction chamber was maintained at 2000 Pa (15 torr). A sequential plasma pretreatment phase comprised contacting the substrate simultaneously with a hydrogen and nitrogen plasma for 2 seconds, and subsequently contacting the substrate with a second nitrogen plasma in the absence of hydrogen plasma for 2 seconds. During the SiN deposition phase the substrate was contacted with a silicon precursor.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of depositing a SiN thin film on a three-dimensional structure on a substrate in a reaction space by an atomic layer deposition (ALD) process comprising a plurality of deposition cycle comprising:
    a sequential plasma pretreatment phase comprising:
        contacting the substrate with a first hydrogen plasma; and
        after contacting the substrate with the first hydrogen plasma, contacting the substrate with a second nitrogen plasma in the absence of hydrogen plasma; and
    a silicon nitride deposition phase comprising alternately and sequentially contacting the substrate with a silicon hydrohalide precursor and a nitrogen reactant.

2. The method of claim 1, wherein contacting the substrate with the first hydrogen plasma comprises simultaneously contacting the substrate with the first hydrogen plasma and a nitrogen plasma.

3. The method of claim 1, wherein the sequential plasma pretreatment phase is carried out in each deposition cycle.

4. The method of claim 1, wherein the first hydrogen plasma is generated with a first power and the second nitrogen plasma is generated with a second power that is less than or equal to the first power.

5. The method of claim 1, wherein the second nitrogen plasma is formed in N₂ gas.

6. The method of claim 1, wherein the SiN film has a step coverage of about 100% to about 300% on the three-dimensional structure.

7. The method of claim 1, wherein the three-dimensional structure on the substrate has an aspect ratio (AR) of greater than or equal to 3.

8. The method of claim 7, wherein the three-dimensional structure comprises a side-wall, and the side-wall conformality of the SiN film is greater than 100%.

9. A plasma enhanced atomic layer deposition (PEALD) method for depositing SiN over a three-dimensional structure on a substrate in a reaction space comprising a deposition cycle comprising, in order:
    a sequential preplasma pretreatment phase comprising:
        contacting the substrate with a first plasma generated in a mixture of H₂ and N₂ gas; and
        contacting the substrate with a second plasma generated in N₂ gas in the absence of H₂ gas; and
    a deposition phase comprising contacting the substrate with a silicon precursor,
    wherein the deposition cycle is repeated two or more times sequentially.

10. The method of claim 9, wherein the first plasma is generated at a first plasma power and the second plasma is generated at a second plasma power that is lower than the first power.

11. The method of claim 9, wherein the silicon precursor comprises a silicon hydrohalide.

12. The method of claim 9, further comprising purging the reaction space prior to contacting the substrate with the silicon precursor and after contacting the substrate with the first plasma and the second plasma.

13. The method of claim 9, wherein N₂ gas is flowed into the reaction space continuously throughout the deposition cycle.

14. The method of claim 9, wherein the three-dimensional structure comprises a trench with side walls and a top region and the SiN film has a side-wall conformality of greater than 100%.

15. The method of claim 9, wherein the SiN film has a ratio of a wet etch rate (WER) in dilute HF of the silicon nitride thin film on the sidewalls of the three-dimensional feature to a wet etch rate (WER) in dilute HF of the silicon nitride thin film on a top region of the three-dimensional feature of about 0.02 to about 3.0.

16. A method of depositing SiN by plasma enhanced atomic layer deposition (PEALD) on a substrate in a reaction space comprising a plurality of deposition cycles comprising:
    contacting the substrate with a first plasma generated by applying a first plasma power to a gas comprising hydrogen and nitrogen; and
    subsequently contacting the substrate with a second plasma generated by applying a second plasma power to a gas comprising nitrogen but not hydrogen; and
    a deposition phase comprising alternately and sequentially contacting the substrate with a silicon halide and a nitrogen precursor.

17. The method of claim 16, wherein the second power is less than the first power.

18. The method of claim 16, wherein the silicon reactant is a silicon hydrohalide.

19. The method of claim 16, wherein the first plasma power is greater than or equal to the second plasma power.

20. The method of claim 16, wherein the SiN is deposited on a trench having an aspect ratio of greater than 3 and has a conformality of greater than 100%.

* * * * *